United States Patent [19]

Comette

[11] 3,887,783

[45] June 3, 1975

[54] DEVICES FOR WELDING OF INTEGRATED-CIRCUIT WAFERS

[75] Inventor: Robert Comette, Rosny/Bois, France

[73] Assignee: Societe Honeywell Bull (Societe Anonyme), Paris, France

[22] Filed: June 12, 1973

[21] Appl. No.: 369,234

[30] Foreign Application Priority Data

Nov. 9, 1972 France .............................. 72.39749

[52] U.S. Cl. ........................ 219/85; 29/471; 219/85

[51] Int. Cl. ................................................ B23k 1/02

[58] Field of Search ................ 29/471.1, 471.3, 482; 219/85

[56] References Cited

UNITED STATES PATENTS

| | | | |
|---|---|---|---|
| 3,696,985 | 10/1972 | Herring et al. | 29/471.1 X |
| 3,722,072 | 3/1973 | Beyerlein | 29/471.3 |
| 3,724,068 | 4/1973 | Galli | 219/85 X |
| 3,743,558 | 7/1973 | Ludwig | 29/471.1 X |

*Primary Examiner*—Arthur T. Grimley
*Assistant Examiner*—N. D. Herkamp
*Attorney, Agent, or Firm*—Baldwin, Wight & Brown

[57] ABSTRACT

A device for soldering chips (e.g. integrated circuit chips) to a metallized substrate, said chips being previously mounted on a carrier film having metallizations thereon. This device comprises a plate for supporting the film having chips mounted thereon, said plate being provided with a die on which each chip of the film is successively adjusted, each adjusted chip overhanging said die. This device further comprises a bonding head, the peen of which is shaped to be engaged in said die for cutting the leads of each adjusted chip, each chip being thus detached from the film and carried by the bonding head to be soldered on the substrate.

5 Claims, 7 Drawing Figures

DEVICES FOR WELDING OF INTEGRATED-CIRCUIT WAFERS

The present invention deals with improvements of devices for the soldering of integrated-circuit wafers on a substrate.

The modern techniques applied today to create electronic equipment and, more particularly, information-processing systems, increasingly turn to the use of integrated circuits not enclosed in casings. These integrated circuits without casing, known most frequently by the term dice, integrated-circuit crystals or also as "chips" in English, have generally the appearance of small rectangular tablets whose sides measure from about 2 to 3 millimeters.

It is now common knowledge that each chip is provided on its surface with contact studs intended for the bonding or soldering of conductors thereto whose function it is to connect the chip electrically with the conductive parts of a printed-circuit substrate. To facilitate the handling of these relatively small chips they conventionally are attached to a thin plastic film or compliant strip bearing a number of rectangular openings in whose centers the integrated-circuit chips are placed. Each chip is, for this purpose, maintained by a system of conductors associated with the plastic film within the openings thereof so that the inner ends of these conductors are soldered to the contact studs of the chip. Each system of conductors radiate inwardly from the edges of the associated film opening. If one wishes to lift a wafer from the film to solder it on a printed-circuit substrate, it is sufficient to cut off these conductors at a short distance from the edge of that wafer and to solder then the remaining portions of the conductors of this chip to the conductive parts of that printed-circuit substrate.

This soldering may be carried out by using an appropriate device, such, as for example, that which was described and represented in the French Pat. No. 2,060,924, which permits the simultaneous soldering of all the conductors of an integrated-circuit chip on a printed-circuit substrate. The handling of this device is, however, very delicate due to the fact that the conductors of the chip are generally very thin and very close to each other and that it is necessary under these conditions to place the chip with utmost precision onto the strip if the conductors of that chip should be perfectly coordinated with the conductive parts of the substrate to which they are to be soldered. Such a device, furthermore, requires that the chip which was lifted off the plastic film be put in its place by hand or by pincers within a seat provided in the lower part of the heating peen of this device. By this positioning operation, however, one runs the risk of deforming or even damaging the conductors of the chip. This, of course, forces the operator to straighten out the bent conductors so as to accomplish the coincidence between these conductors and the conductive parts of the substrate. The soldering, that may be effected with such a device, thus turns out to be quite slow, especially if one wants to be certain that the conductors to be soldered are placed correctly.

The present invention corrects these drawbacks and offers a device for rapid soldering of integrated-circuit chips, previously mounted on a thin film, onto a printed-circuit substrate, accomplishing, at the same time, a correct positioning of the conductors of the chips on the corresponding conductive parts of the printed-circuit substrate.

An objective of the invention is concerned with a device for attaching on a printed-circuit strip at least one integrated-circuit chip, previously mounted on a thin plastic film which has at least one opening in the center where said integrated-circuit chip is lodged; the latter is equipped with a number of conductors and linked to the film by these conductors. Said device includes a support for positioning of said printed-circuit substrate and a bonding head whose heating peen is equipped with a seat for the chip when the latter by cutting-off of the conductors at a short distance from the edges of that chip is lifted off the film; said peen is capable of applying during the soldering the remaining portions of the conductors of the chip to the conductive parts of the printed-circuit substrate. Said device is characterized, in that it comprises, moreover, driving and guiding organs for the displacement of the bonding head in a perpendicular direction to the substrate, in a first position in which it is more distant from the strip and in a second position in which it is in contact with that substrate, and a die, placed on the path of the bonding head so as to enable the peen, when the head has moved from its first to its second position, to cut off the conductors of a chip which, mounted on a film, had previously been placed on that die. This chip is taken immediately after the cutting-off by said head to be placed on the printed-circuit substrate and to be soldered there.

Other characteristics and advantages of the invention will evolve in the following description, presented for non-limiting exemplary reasons, and by reference to the attached drawings in which.

Figure 1:
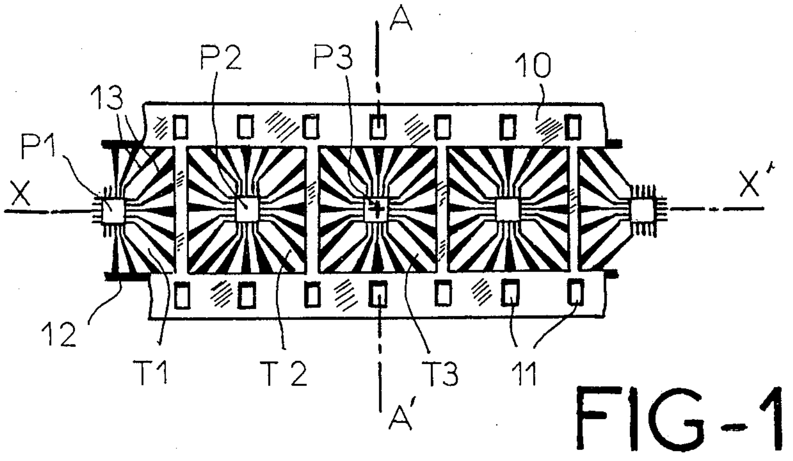
FIG. 1 represents a section of a thin plastic film on which integrated-circuit chips are mounted.

FIG. 1 is intended to illustrate the manner in which the integrated-circuit chips, which may be used in the device according to the invention, are mounted on a thin plastic film. This plastic film, marked 10 on FIG. 1, usually consists of a material of the polyamide type and is equipped along each of its edges with a series of perforations 11 which, spaced in regular intervals, permit the driving of the film by a suitable moving mechanism. This film exhibits in its center portion a series of rectangular openings T1, T2, T3, etc. . . in whose center an integrated-circuit wafer P1, P2, P3, etc. . . is set. As may be seen in FIG. 1 a copper band 12 of several hundredth of millimeter thickness is hot-rolled on this film. At each opening of the film, this band 12 is cut in such a way that only the conductive bands 13 remain which starting off from the edges of each opening end at the chip set in the center of that opening, each of these conductive bands being soldered at its end to the contact stud of that chip. Each wafer is thus made an integral part of the film and it is sufficient, therefore, if one wishes to lift off one of these chips, to cut off the conductive bands which tie it to the film, at a very short distance (generally on the order of 2 millimeters) from its edges.

FIG. 1 also shows each integrated-circuit chip to be positioned at the intersection of the longitudinal symmetry axis XX′ of the film and an axis, such as AA′, perpendicular to the former and passing through two marginal perforations 11 symmetrical to each other in relation to XX′.

This arrangement makes it possible, as will be seen later on, to accomplish a precise positioning of the chips in the device according to the invention, when these perforations are used to frame the film.

Figure 2:
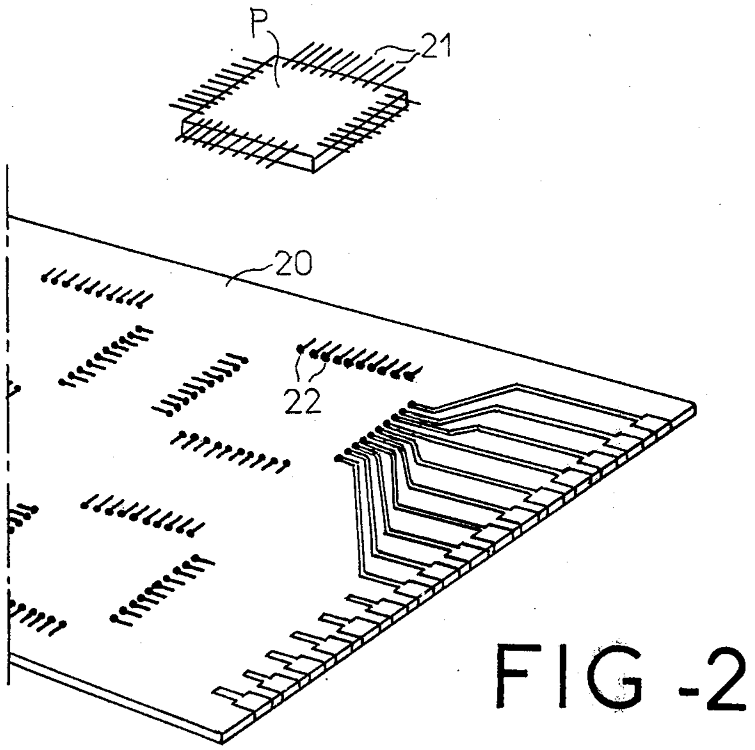
FIG. 2 represents in perspective a portion of the printed-circuit substrate and an integrated-circuit chip intended to be soldered on that substrate.

FIG. 2 illustrates in diagram form the appearance presented by a printed-circuit strip 20 where integrated-circuit chips are to be attached which were previously mounted on this plastic film. One of these chips, marked P, is shown in FIG. 2. This wafer, after being detached from the film, carries on each of its four sides a series of conductors 21, resulting from the cutting-off of the conductive bands 13, which previously kept that chip attached to the film. In the example shown in FIG. 2, this chip bears ten conductors on each side. It must be kept in mind, though, that the number of conductors 21 with which each chip is equipped on each side may be any, f.i. four or eight or more. These conductors 21, which are to be soldered to the appropriate conductive parts 22 of the strip 20 are coated with a fusible metallic material, such as tin.

The device which according to the invention attaches on a printed-circuit substrate integrated-circuit chips, mounted previously on a thin plastic film, will now be described by referring to the FIGS. 3 and 4.

This device comprises a lower support plate 30 and an upper support plate 31 joined with each other by uprights 32 in such a manner so as to form a casing in whose interior a mobile carrier 33 is able to move that functions as a support for a printed-circuit substrate 20. On the upper support plate 31 two vertical guides 34 and 35 are attached between which a mobile support, consisting mainly of a plate 36, may slide. The lower end of this plate 36 is equipped with a bonding or soldering head 37 which will be described in detail later on. In FIGS. 3 and 4, a thin plastic film 10 is illustrated, set in its position on the support plate 31. This film passes under the bonding head 37 between the two guides 34 and 35. Moving step-by-step forward, the film 10 is guided laterally by two slides 38 and 39. Its drive is effected by a forward-moving device 40 fastened to the support plate 31. A frame 41, attached to the support plate 31, supports the driving device of the plate 36.

In the described example, this device consists of a known system of a worm and rack whose worm 42 is mounted on the shaft of an electric motor M and whose rack 43 is fastened to a rod with vertical control 44, which in turn is linked to the plate 36 by a coupling bar 45. The control rod 44 is equipped with a flange 46 which activates, during the displacement of that rod, two electric contacts CH and CB which will be discussed thereafter.

Figure 3:
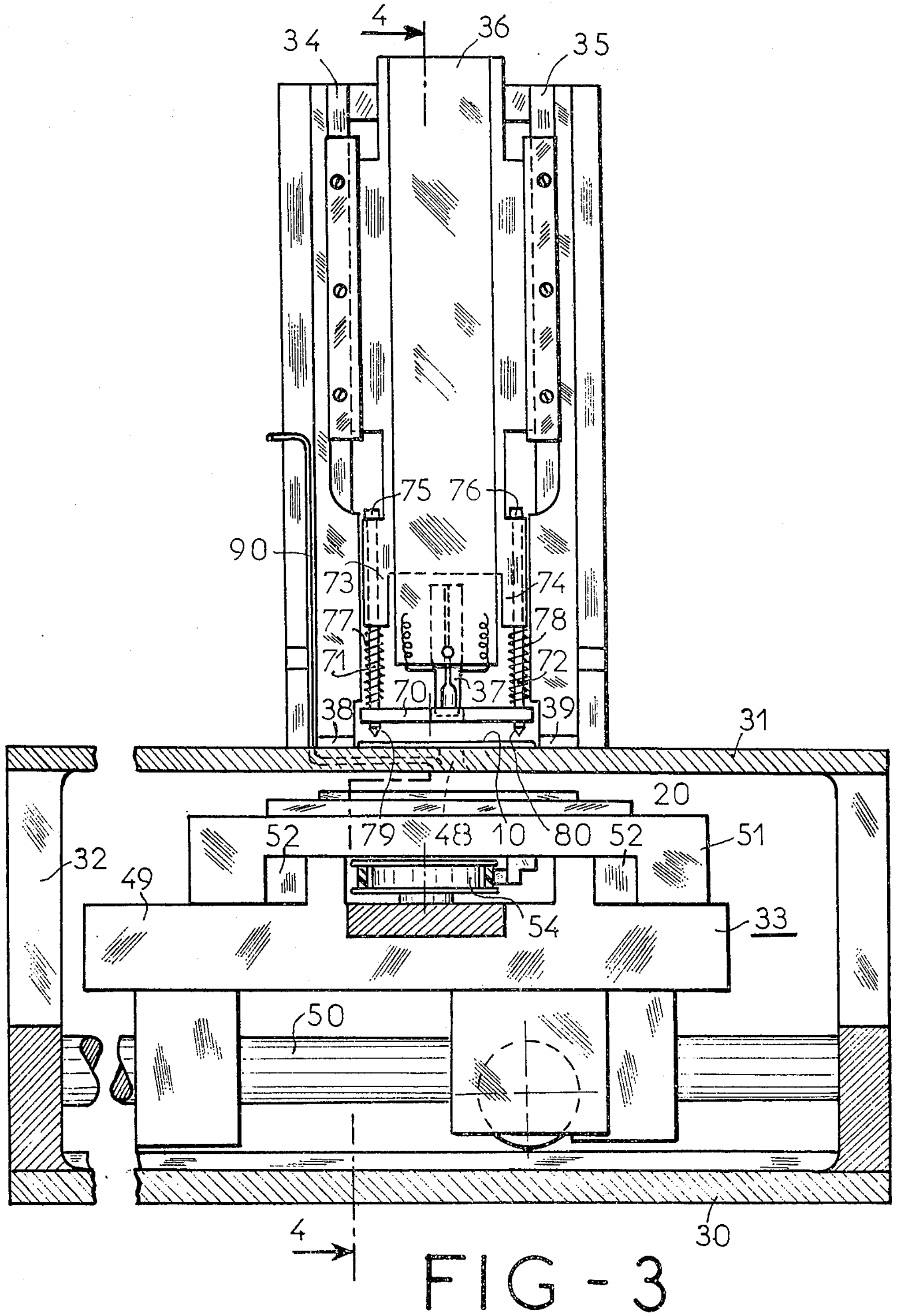
FIG. 3 represents an elevation view in partial section of a device designed according to the invention, for attaching on a printed-circuit strip integrated-circuit chips, previously mounted on a thin plastic film.
Figure 4:
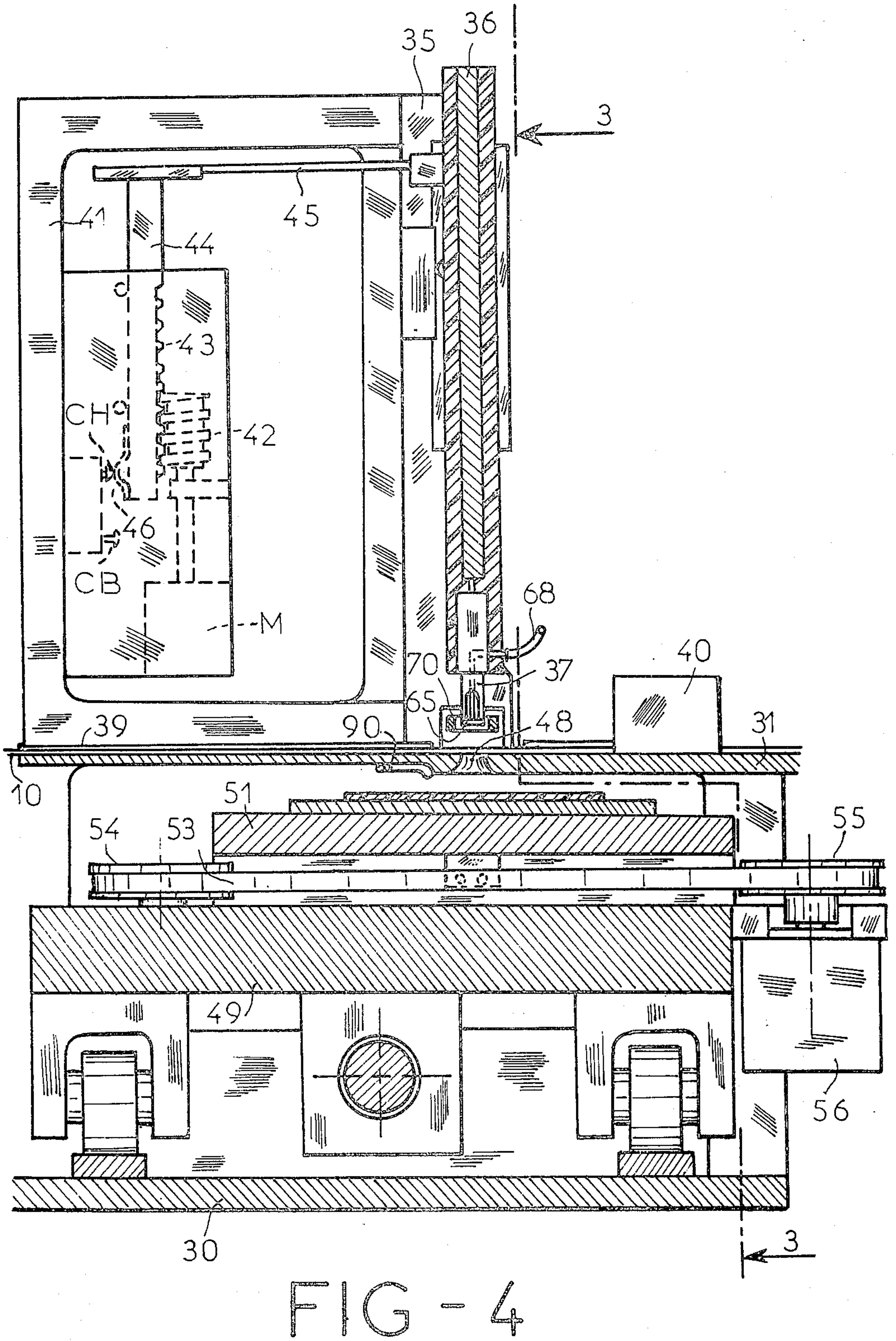
FIG. 4 is a view of a section along 4—4 of the device of FIG. 3.

The plate 36 is shown in high position in the FIGS. 3 and 4. In that position, the bonding head 37 is positioned above the support plate 31 and the flange 46 keeps the contact CH interrupted. An electric circuit, to be described below, provides, however, by suitable energizing of the motor M the control of the downward displacement of the system consisting of the rod 44, the bar 45, the plate 36 and the bonding head 37. So that during that movement the bonding head may come into contact with the substrate 20 which is located on the mobile carriage 33, an opening 48 of suitable dimensions being provided in the support plate 31.

The FIGS. 3 and 4 also show the mobile carriage 33 consisting of a lower plate 49 which is slidably mounted on a horizontal guiding rod 50, which plate may be moved in a direction transverse to the direction of the forward movement of the plastic film 10. The carriage also includes an upper plate 51, which as guided by the slides 52 may be moved parallel to the direction of the advancing film by a system including driving belt 53 that, in solid connection in one point with the upper plate 51, is stretched over two pulleys 54 and 55 of which one pulley 54 is mounted loosely on an axis integrally connected with the lower plate 49 and of which the other pulley 55 is fastened to the shaft of a motor 56 which in turn is attached to this lower plate.

Command- and control organs of a known type, permitting, due to the displacements of the plates 49 and 51, to position with precision the substrate 20 in relation to the bonding head 37, are also provided. Yet these organs will not be described since they are not part of the invention. They were, besides, not shown in the drawings to avoid an overloading of these.

Figure 5:
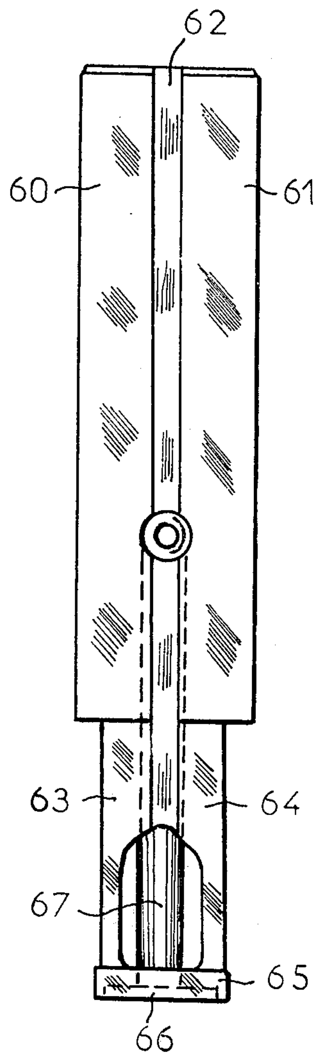
FIG. 5 is a more detailed view of the die- and bonding head used in the device of FIG. 3.

The purpose of FIG. 5 is to show the composition of the bonding head which is used in the device according to the invention. This head is essentially made up of two rigid metallic elements 60 and 61 which are attached on both sides to a parallelepipedic block 62 of insulating material. As may be seen in FIG. 5, these two elements surround almost completely the lateral faces of block 62, though remaining electrically insulated from each other. These two elements are extended downward by two electrical posts 63 and 64. The end of each of their arms is welded to one of the four corners of a heating peen 65 of a square shape. The lower face of that peen is equipped with a recess 66 functioning, as will be seen later on, as the seat of an integrated-circuit chip, which, after having been detached from the plastic film, must be soldered to the printed-circuit substrate put in its place on the upper plate 51. The bonding head is, furthermore, equipped with a duct 67 whose one end, fastened to the heating peen 65, ends in the recess 66 and whose other end, extending from the bonding head between the elements 60 and 61, is linked by means of a thin pipe 68 (FIG. 4) to a pneumatic device to be discussed later on.

Figure 6:
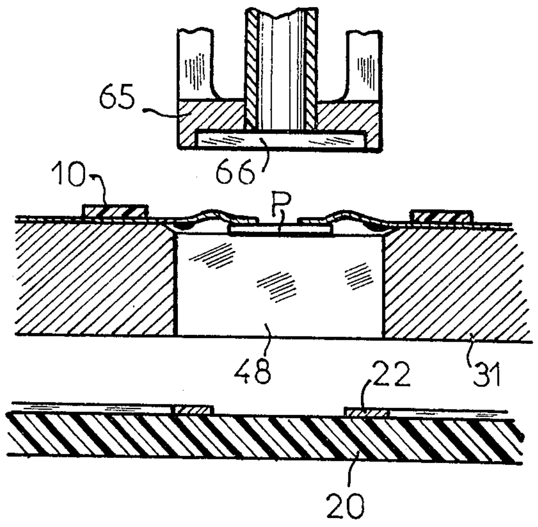
FIG. 6 is a view of a section showing the positions which the thin plastic film and the printed-circuit substrate have to occupy in the device of FIG. 3 so that the cutting- and welding operations may be performed.

The opening 48 of the support plate 31 is designed in such a manner that its contour on the upper face of that support plate corresponds practically in shape with that of the heating peen 65, while, however, leaving sufficient play for the bonding head to move without undergoing frictions when it passes through that opening. In these conditions, the opening 48 of the support plate 31 plays the part of a die in which the heating peen 65 is engaging in the course of the descending movement of the bonding head. This peen thus forms a punch to cut off the conductive bands of an integrated-circuit wafer P, which, mounted on a thin plastic film 10, was previously placed above that opening 48, as shown in FIG. 6. So that the film 10, in the course of this operation, remains pressed to that support plate 31, the plate 36 is equipped with a film press which, as may be seen in the FIGS. 3 and 4, consists of a small horizontal bar 70 fastened to the lower ends of two vertical guiding posts 71 and 72, capable of sliding in two sleeves 73 and 74 which are integral parts of the plate 36. Two retaining screws 75 and 76, attached to the upper ends of the guiding posts 71 and 72, resp., prevent their being detached from their respective sleeves. When the plate 36 is in high position, the horizontal bar 70 resides in its lower position due to the action of two springs 77 and 78, seating the screws 75 and 76. The bar 70 thus is on a level slightly below that of the heating peen 65. This bar 70, which is equipped with a hole intended for the passing of the bonding head 37, is provided, furthermore, with two positioning points 79 and 80 so arranged as to be able to engage in the marginal perforations of the plastic film 10. When, after the film is displaced to bring one of the integrated-circuit chips approximately to the center of the opening 48, the motor M is energized so as to cause downward movement of the plate 36, these two points, during their descending movement, engage at the end in the two marginal perforations of the film which are located on both sides of that chip. These two points are machined with utmost precision so as to achieve, in case of need by means of a very slight displacement of the film, a positioning of the chip by which it is exactly centered in the opening 48. This positioning is accomplished just before the bar 70 comes in contact with the film. The plate 36 continues its descent, while the bar 70 is stopped in its movement and thereafter compresses the springs 77 and 78, thus forcing the bar to keep the film firmly pressed against the support plate 31. The bonding head, penetrating then into the opening 48, cuts off the conductors of the wafer positioned on that opening, so that the chip then finally lodges, in the source of this operation, in the recess 66 of the heating peen 65 and remains there held in place by suction until the soldering operation.

Figure 7:
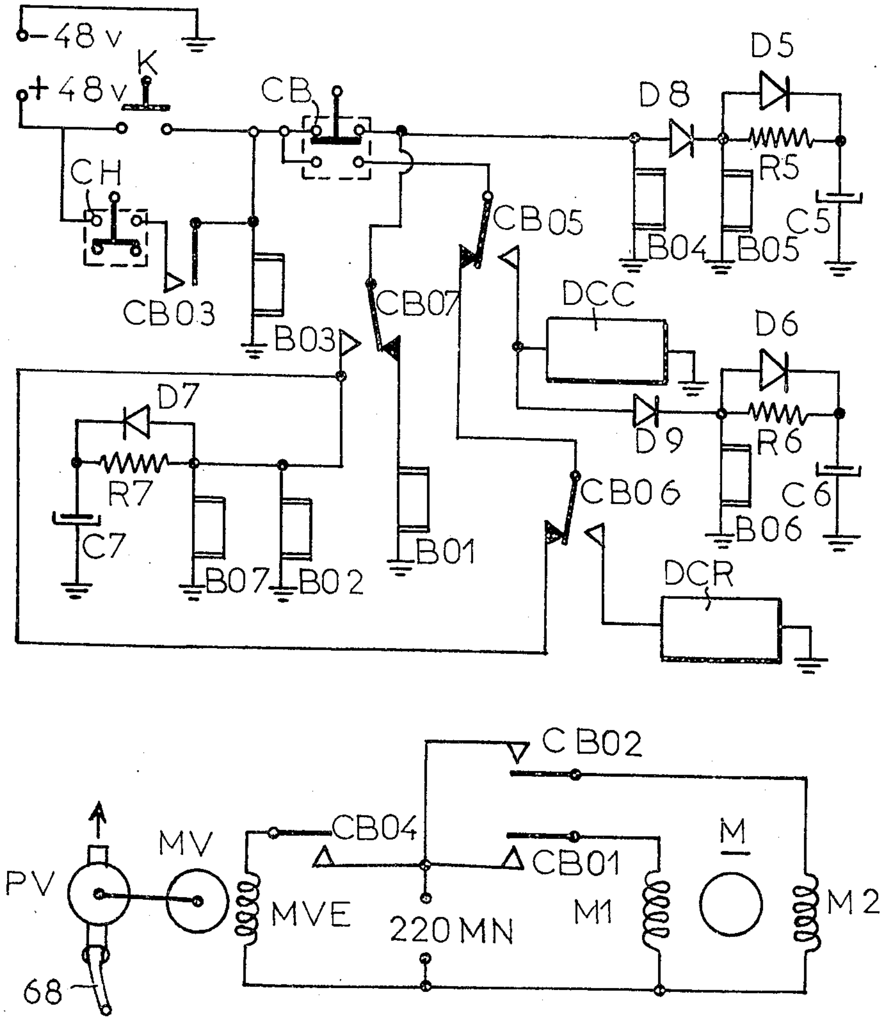
FIG. 7 represents a diagram of electric control- and command circuits of the device of FIG. 3.

To control the operation of the just described device one makes use of a control circuit which is preferentially designed in the fashion indicated in FIG. 7. The electric diagram of FIG. 7 is a skeleton diagram which comprises manual-control contacts and relay contacts provided for use in conditions which will be described. The relay contacts are designated by the same reference marks as the relay which controls them, but preceded by the letter C. A normally closed contact, when the relay which controls it is not energized, is represented in this diagram by a black triangle. The relays shown in FIG. 7 are normally fed by a direct current taken between two terminals +48 V and −48 V. The feeding of these relays is triggered, as may be seen later on, by a push-button switch K.

The electric motor M which drives the plate 36 is a motor in which the reversal of the direction of rotation is effected in a known manner according to the type of motor used. It should be assumed that in the described example this motor is of the AC type and comprises two inductor windings M1 and M2, wound in an opposite way so that, when one of the windings is energized, the motor turns in one direction, while, when the other coil is energized, the motor turns in the reverse direction. These two windings M1 and M2 may be fed by an AC monophase current of 220 V supplied by two terminals 220 MN by means of two switch contacts CB01 and CB02, controlled by two relays B01 and B02, resp.

The pneumatic device which, linked to the duct 67 by a tube 68, maintains the chip by suction in the recess 66 of the heating peen, consists in the described example of a rotating vacuum pump PV of a known type, driven in rotation by a motor MV with AC current. The motor MV has a winding MVE which may be fed by an AC current supplied by the terminals 220 MN through a switch contact CB04 controlled by a relay B04.

It will have to be kept in mind that initially the printed-circuit substrate 20 placed on the upper plate 51 was positioned correctly in relation to the bonding head and that the integrated-circuit chip, intended to be lifted off the film 10, may be soldered onto this strip, is lodged in the center of the opening 48 of the support plate 31. When one presses now on the switch K, to keep it closed until the contact CH, as will be seen later on, is raised, a direct current runs from +48 volts through the intermediary of the switch K and the non depressed contact CB and energizes, on the one hand, the relay B04 and the relay B05, and on the other hand, by the intermediary of a reversing switch CB07 in break position, the relay B01. The same current charges a condenser C5 over two diodes D8 and D5. On the other hand, the current which runs from +48 volts through the intermediary of the switch K excites a relay B03 which closes its contact CB03. The relay B04, energized, closes its contact CB4 and thus permits the feeding of the winding MVE with AC monophase current, supplied by the terminals 220 MN. The motor MV then turns, driving the vacuum pump PV. The relay B05, energized, switches its contact CB05 to make position. Finally, the relay B01, energized, closes its contact CB01, permitting thus the feeding of the winding M1 M with AC current, supplied by the terminals 220 MN. The motor M now turns to cause the descent of the system consisting of the control rod 44, the bar 45, and the plate 36. During this movement, the flange 46, which is attached to the rod 44, detaches itself from the electrical contact CH. This contact CH, being no longer kept depressed by the flange 46, goes up and, provided that care was taken to keep the switch K pressed down to maintain the relays B03, B04, B05, and B01 energized, a direct current runs from +48 volt, through the intermediary of the contacts CH and CB03 to energize the relay B03. The relay B03 thus remains energized even when, from this moment on, one ceases to press on the switch K. In the same way, the relays B04, B05, and B01 continue to be energized as long as the contact CB is not depressed by the flange 46. In the course of the downward movement of the plate 36, the bonding head 37, penetrating the opening 48, cuts the conductors from the chip positioned on the opening. That wafer, lifted off the plastic film, is, however, kept in the recess 66 of the heating peen, due to suction generated by the vacuum pump PV. This wafer is thus carried by the bonding head 37 until the heating peen fastens the remaining portions 21 of the conductors of that chip to the conductive parts 22 of the printed-circuit substrate. The contact CB is placed in such a way as to be depressed by the flange 46 in the moment in which the chip which is carried by the bonding head contacts the printed-circuit substrate. Due to the depressing of the contact CB, the relay B01 ceases to be energized at this moment and opens its contact CB01. Since the winding M1 is now no longer fed by the current, the motor M stops, arresting in this fashion the descent movement of the plate 36 and of the bonding head 37. At the same time, the depressing of the contact CB entails the deenergizing of the relay B04. Due to this fact, the contact CB04 opens, cutting thus the feeding with current of the winding MVE. The motor MV then stops and the vacuum pump PV ceases to keep up the suction which is produced inside the tube 68 of the duct 67 and the recess 66. The depressing of the contact CB interrupts the feeding of the relay B05 from +48 volt. Yet this relay B05 continues being energized during a certain period after the depressing of the contact CB due to the discharge over the resistor R5 of the condenser C5 which is connected in parallel with the relay B05. It will now be understood that during all this time a direct current runs from +48 volt through the intermediary of the non depressed contact CH, of the closed contact CB03, of the depressed contact CB, and of the reversing switch CB05 in make position, and energizes, on the one hand, a device DCC controlling the electrical feeding of the heating peen 65, on the other hand, a relay B06. This same current, moreover, charges a condenser C6 over two diodes D9 and D6. The relay B06, energized, switches its contact CB06 into make position. The device DCC is of a sufficiently known type which makes it unnnecessary to describe it. This device may consist, f.i. of a relay controlling a contact mounted in series in the feed circuit of the heating peen 65. As long the relay of this device is energized, the heating peen 65 is thus heated and performs the melting of the fusible material with which the conductors of the chip are coated which was put in place on the printed-circuit substrate. Thereafter, the relay B05, ceasing to be energized by the discharge current of the condenser C5, switches its contact CB05 into break position. At this moment, the device DCC is no longer energized, so that the heating peen 65 ceases to be heated. The switch CB05 does not permit any more the relay B06 to be fed from +48 volt. Yet this relay B06 continues to be excited during a certain period due to the discharge over a resistor R6 of the condenser C6. One realizes then that during all that time a direct current runs from +48 volt over the non depressed contact CH, the closed contact CB03, the depressed contact CB, the contact CB05 in break position and the contact CB06 in make position, and energizes a device DCR controlling the release of a cold-air current to the heating peen 65. This device will not be described since its structure is known. It will be merely mentioned that in the example under consideration that device includes an electromagnet whose mobile armature controls the opening of a pneumatic valve mounted between a reservoir of compressed air and an air duct 90 which is partially represented in the FIGS. 3 and 4. Returning to FIG. 7, it may be seen that, when the relay B06 ceases to be energized by the discharge current of the condenser C6, the contact CB06 returns to break position. The device DCR, being no longer fed, stops the flow of air intended for the cooling of the heating peen. Due to the switching of the contact CB06, a direct current runs from +48 volt through the intermediary of the non depressed contact CH, of the closed contact CB03, of the pressed contact CB and the contacts CB05 and CB06 in break position, and energizes a relay B07 as well as the relay B02. The same contact charges a condenser C7 over a diode D7. The relay B07, energized, switches its contact CB07 to make position. The energized relay B02 closes its contact CB02, permitting thus the feeding of the winding M2 by AC current furnished by the terminals 220 MN. The motor M then revolves to bring about the rise of the system consisting of the control rod 44, the bar 45, the plate 36, and the bonding head 37. During this movement, the flange 46 detaches itself from the electrical contact CB which rises. A direct current runs then from +48 volt over the non depressed contact CH, the closed contact CB03, the non depressed contact CB and the contact CB07 in make position, and continues to energize the relays B02 and B07. It must be pointed out that in the moment in which the contact CB goes up, the electrical circuit which from +48 volt permits the energizing of the relays B02 and B07, is interrupted during a very short time interval which corresponds with the passage from the depressed position to the non depressed position of the contact CB. At any rate, during that time interval, the energizing of the relays B02 and B07 is maintained by the discharge over a resistor R7 of the condenser C7 which is connected in parallel to these relays. In this manner, the contact CB07 is not able to switch into break position when the contact CB returns to the non depressed position. The rising movement of the plate 36 and of the bonding head 37 goes on up to the moment in which the flange 46, meeting again the contact CH, depresses it. This depressing causes the deenergizing of the relays B03, B02, and B07. The relay B07, deenergized, switches then its contact CB07 into break position, while the relays B03 and B02, deenergized, open their resp. contacts CB03 and CB02. Since the winding M2 is then no longer fed by current, the motor M stops, halting thus the rising movement of the plate 36 and of the welding head 37.

I claim:

1. A device for soldering to a substrate integrated circuit chips mounted previously on a carrier film, said film comprising a series of openings and a conductive sheet hot-rolled on one surface of said film, said sheet forming at each opening a plurality of flexible leads extending towards the center of said opening and bonded to a chip located in said center, said device comprising:
 - a first support plate for supporting said substrate,
 - a bonding head movable in a direction perpendicular to said plate,
 - means for displacing said head between a first position in which it is at a distance from said substrate and a second position in which it is in contact with said substrate,
 - a second support plate, disposed between the first support plate and the bonding head when this latter is in its first position, for supporting the film having chips mounted thereon, said second support plate being provided with a die opening positioned on the bonding axis of the head,
 - and means for adjusting successively each chip of the film on the bonding axis of the head, each adjusted chip overlying said die opening, said bonding head comprising a peen shaped to be engaged in said die opening for cutting the leads of the adjusted chip, when the bonding head is displaced from its first position to its second position for soldering to said substrate the remaining portions of the leads of said chip which, after this cutting-off has been completed, is carried by said peen to said substrate.

2. A device for soldering to a substrate integrated circuit chips mounted previously on a carrier film, said film comprising a series of openings and a conductive sheet hot-rolled on one surface of said film, said sheet forming at each opening a plurality of flexible leads extending towards the center of said opening and bonded to a chip located in said center, said device comprising:

a first support plate for supporting said substrate, a bonding head movable in a direction perpendicular to said plate, means for displacing said head between a first position in which it is at a distance from said substrate and a second position in which it is in contact with said substrate, a second support plate, disposed between the first support plate and the bonding head when this latter is in its first position, for supporting the film having chips mounted thereon, said second support plate being provided with a die opening positioned on the bonding axis of the head, means for adjusting successively each chip of the film on the bonding axis of the head, each adjusted chip overlying said die opening, said bonding head comprising a peen shaped to be engaged in said die opening for cutting the leads of the adjusted chip, when the bonding head is displaced from its first position to its second position, said peen having a recess for receiving said chip when the latter, after said cutting-off has been completed, is lifted off the film, and pneumatic means for maintaining said chip in said recess between the instant where this chip is lifted off the film and the instant where the remaining portions of the leads of said chip are applied by the peen to be soldered on the substrate.

3. A device according to claim 2, which additionally comprises:

means for guiding the film on the second support plate, and advancing means to advance the film after a chip has been soldered on the substrate, and thus advancing another mounted chip to the bonding axis.

4. A device according to claim 3, wherein, said film being provided with marginal perforations to be engaged in the advancing means, and said holes being distributed in relationship with the positions of the chips mounted on said film, the adjusting means comprises a film press fastened on the bonding head for applying said film on the die before the bonding head fits in said die, and positioning pins fixed on said film press and arranged to be engaged in the perforations placed in the vicinity of the die, just before said film press contacts said film.

5. A device according to claim 2, wherein the displacing means comprise a mobile support on which the bonding head is mounted, worm-drive means associated to said mobile support for moving this support in a direction perpendicular to the plane of first support plate, and an electric motor associated to said worm-drive means for controlling the displacement of the bonding head from its first position to its second position, and inversely.

* * * * *